(12) United States Patent
Golder

(10) Patent No.: US 8,157,113 B2
(45) Date of Patent: Apr. 17, 2012

(54) HOISTING DEVICE WITH EXTENDED LOAD RANGE

(75) Inventor: Markus Golder, Ettlingen (DE)

(73) Assignee: Stahl CraneSystems GmbH, Kunzelsau (DE)

( * ) Notice: Subject to any disclaimer, the term of this patent is extended or adjusted under 35 U.S.C. 154(b) by 50 days.

(21) Appl. No.: 12/441,083

(22) PCT Filed: Aug. 1, 2007

(86) PCT No.: PCT/EP2007/006799
§ 371 (c)(1),
(2), (4) Date: Mar. 27, 2009

(87) PCT Pub. No.: WO2008/031477
PCT Pub. Date: Mar. 20, 2008

(65) Prior Publication Data
US 2009/0272710 A1    Nov. 5, 2009

(30) Foreign Application Priority Data
Sep. 12, 2006   (DE) .................. 10 2006 043 492

(51) Int. Cl.
*B66C 13/12* (2006.01)
(52) U.S. Cl. ........ 212/284; 212/285; 254/267; 254/274; 254/275
(58) Field of Classification Search ............ 212/284, 212/285; 254/267, 274, 275
See application file for complete search history.

(56) References Cited

U.S. PATENT DOCUMENTS

| | | | | |
|---|---|---|---|---|
| 1,670,734 | A * | 5/1928 | Moore | 254/285 |
| 2,253,253 | A * | 8/1941 | Sohn | 318/773 |
| 3,375,938 | A * | 4/1968 | Crittenden et al. | 212/274 |
| 4,004,156 | A * | 1/1977 | Schuller | 307/113 |
| 5,965,994 | A | 10/1999 | Seo | |
| 7,068,009 | B2 * | 6/2006 | Freitag et al. | 318/727 |
| 7,090,200 | B2 * | 8/2006 | Morse et al. | 254/332 |
| 7,353,959 | B2 * | 4/2008 | Zakula et al. | 212/278 |
| 2002/0039010 | A1 * | 4/2002 | Plasz et al. | 318/567 |
| 2003/0057916 | A1 * | 3/2003 | Davis et al. | 318/800 |
| 2003/0205703 | A1 * | 11/2003 | McCormick et al. | 254/267 |
| 2005/0098768 | A1 * | 5/2005 | Malek et al. | 254/267 |
| 2005/0247657 | A1 * | 11/2005 | Sparenborg et al. | 212/325 |

FOREIGN PATENT DOCUMENTS

| | | | |
|---|---|---|---|
| DE | 29 30 439 A1 | | 2/1981 |
| DE | 92 15 732 U1 | | 1/1993 |
| DE | 43 08 836 A1 | * | 9/1994 |
| DE | 196 45 812 C1 | | 2/1998 |
| EP | 0 841 743 A3 | | 5/1998 |
| JP | 06-100293 A | * | 4/1994 |
| JP | 6-255990 A | * | 9/1994 |
| JP | 08-231193 A | * | 9/1996 |

* cited by examiner

Primary Examiner — Emmanuel M Marcelo
(74) Attorney, Agent, or Firm — Leydig, Voit & Mayer, Ltd.

(57) ABSTRACT

A hoisting device or crane can be operated with at least two different maximum loads. The maximum load that can be hoisted in each case is correlated with the hoisting speed in order to prevent the dynamically developed peak load from exceeding the predetermined allowed load limiting values of the components of the crane or the hoisting device.

18 Claims, 6 Drawing Sheets

HOISTING DEVICE WITH EXTENDED LOAD RANGE

CROSS-REFERENCE TO RELATED APPLICATIONS

This patent application is the national phase of PCT/EP2007/006799, filed Aug. 1, 2007, which claims the benefit of German Patent Application No. 10 2006 043 492.7, filed Sep. 12, 2006. Each of the aforementioned documents is herein incorporated by reference in its entirety without exclusion of any portion thereof.

FIELD OF THE INVENTION

The present invention relates generally to hoisting devices, and more particularly to a system for managing load speed in a multi-speed device to avoid shocks.

BACKGROUND OF THE INVENTION

The dimensions of hoisting devices and cranes are generally chosen such that the forces imposed on the various components are within a safe range, i.e., such that failure is unlikely.

In this respect, however, there is a distinction between static and dynamic forces. Static forces are forces that occur when the load is either suspended on the load receptacle means in a motionless fashion or is moving at a constant speed. Dynamic forces, on the other hand, are imposed when the speed at which the load is moved by the load receptacle means changes more or less abruptly, i.e., when the load is accelerated or decelerated. The greatest changes in speed occur when the load is lifted off of a support or, even more critically, when the movement of the load needs to be abruptly stopped due to an emergency situation. In the latter case, the load must be quickly stopped from high speed, e.g., maximum speed. This type of deceleration can impose very high peak forces.

SUMMARY OF THE INVENTION

The invention provides a new hoisting device that accommodates speed-dependent dynamic forces that can occur during operation. The hoisting device, which may also be included as part of a crane, ensures that loads higher than those permissible at normal speed do not lead to overloads as a result of vibrations at a slower hoisting speed. For example, in a hoisting mechanism that operates with two different speeds, namely a normal speed and a crawling speed, this makes it possible to hoist a higher load as long as it is ensured that only the crawling speed can be used. This is achieved by a corresponding control device that automatically sets the corresponding restriction on speed, or via external manipulations that prevent use of the faster speed in order to activate another load limit value.

The novel hoisting device specifically features a geared motor that can operate with at least two different speeds. One of the two speeds is the slower speed while the other is the faster speed. A linear load receptacle means, on which the load to be moved is suspended, is coupled to the geared motor with the aid of driving means. In addition, a load sensor is provided that is designed for determining the weight of the load suspended on the load receptacle means. A suitable load sensor of this type is known, for example, from DE 196 45 812 C1.

The geared motor is connected to a control circuit, to which the load sensor is also connected. The hoisting speed of the geared motor is controlled with the aid of the control unit to restrict the hoisting speed of the geared motor to the slower hoisting speed if the determined weight of the load exceeds a predetermined limiting value.

Subsequently, it can be determined, e.g., by use of another limiting value, whether the load should be hoisted at all, even with the slowest speed, or if instead the hoisting movement remains off limits based on the weight of the load.

According to the invention, at least one limiting value is used that determines if the hoisting operation can be carried out at the faster hoisting speed or not. In the simplest case, this can mean that two load limiting values are provided for a hoisting device with two hoisting speeds. The lower limiting value defines whether or not the hoisting device can be changed over from the slower speed to the faster speed. The higher limiting value decides whether or not a hoisting operation at any speed is permissible.

As long as the load on the hook has a lower weight than the lower limiting value, it is ensured that no dynamic forces that represent a safety risk occur in the hoisting device, namely even during an emergency stop. Consequently, the faster hoisting speed is activated.

No static overload takes place when this lower limiting value is exceeded. However, it is not ensured that the dynamic forces remain within the safety tolerance range during an emergency stop. For this reason, only the slower hoisting speed is activated or used when this limiting value is exceeded.

The ability to hoist loads is only blocked if the load sensor determines that the load has a weight at which dynamic forces outside the safety range of the individual components of the hoisting device or crane support structure can also occur at the slower speed in case of an emergency stop or that the static load is excessively high.

The aforementioned problems of shock-induced vibrations not only occur during braking, but also, e.g., when changing over from one hoisting speed to another with a pole-changing motor, for example, when lifting a load off a support.

The novel hoisting device therefore makes it possible to hoist more or less heavy loads in dependence on the hoisting speed. It is possible, in particular, to hoist loads that are higher than the nominal weight for which the hoisting device is rated at the normal (faster) hoisting speed.

The hoisting device may be included as part of a crane with a crane support structure, wherein the load limiting values that activate and block the respective hoisting speeds are defined on the basis of the most sensitive components, for example, the crane support structure or the chain.

The crane may consist of a bridge crane, wherein the hoisting device is accommodated in a trolley traveling winch. In this case, one of the components that is most sensitive to vibrations is the crane bridge while the trolley traveling winch is at a standstill in the center.

The hoisting device may consist of a chain block or a tackle, but it would also be possible to use a hoisting device in the form of a belt conveyor.

The geared motor may feature an asynchronous motor as the actual driving means. This asynchronous motor may be realized in a pole-changing motor such that at least two speeds can be realized.

The geared motor may be operated together with a frequency converter, wherein the frequency converter may form part of the control device or may be realized separately there from. Rather than two separate speeds, a continuous range of different hoisting speeds could be realized with the aid of a frequency converter.

It is also possible within the invention to utilize a power supply unit that allows any predetermined number of discrete hoisting speeds, for example three hoisting speeds, in connection with an asynchronous motor.

Depending on the design of the hoisting device, the linear load receptacle means may consist of a cable, a chain or a band.

Accordingly, the driving means may consist of a cable drum on which the cable is wound. However, the driving means may also consist of a chain sprocket around which the chain revolves and by means of which the chain is positively driven. In case of a belt conveyor, the driving means consists of a band drum.

As noted, the control unit may merely allow two different speeds or a continuum of hoisting speeds. The control unit may simply comprise a classic control pad that contains the buttons to be manually actuated. The blocking device of the control unit may act upon this control pad in such a way that only the limiting value assigned to the slower hoisting speed is effective, wherein the faster speed is electrically or mechanically blocked by the blocking device.

The limiting value, above which a faster hoisting speed is allowed, can be defined such that the load peaks occurring during an emergency braking maneuver or when changing over to the next faster or slower speed stage remain below the permissible maximum load of the hoisting device or its components or of the crane support structure.

A continuum of limiting values may also be provided parallel to a continuum of hoisting speeds. However, very simple ratios are achieved if a number of discrete limiting values is provided. In the simplest instance, this number is 2.

In other respects, additional refinements of the invention form the objects of the dependent claims.

Other objects and advantages of the invention will become apparent upon reading the following detailed description and upon reference to the drawings, in which:

BRIEF DESCRIPTION OF THE DRAWINGS

The following description of the drawings only concerns the essential aspects of the invention. It should be clear that numerous modifications are possible. A person skilled in the art can conventionally gather less significant details that are not described from the drawings that supplement the description in this respect.

The drawings are not necessarily illustrated true-to-scale. Certain regions may be illustrated excessively large in order to elucidate the essential details. The circuit elements are also largely illustrated in the form of functional switching components only.

While the invention is susceptible to various modifications and alternative constructions, a certain illustrative embodiment thereof has been shown in the drawings and will be described below in detail. It should be understood, however, that there is no intention to limit the invention to the specific form disclosed, but on the contrary, the intention is to cover all modifications, alternative constructions, and equivalents falling within the spirit and scope of the invention.

DESCRIPTION OF THE PREFERRED EMBODIMENTS

Figure 1:
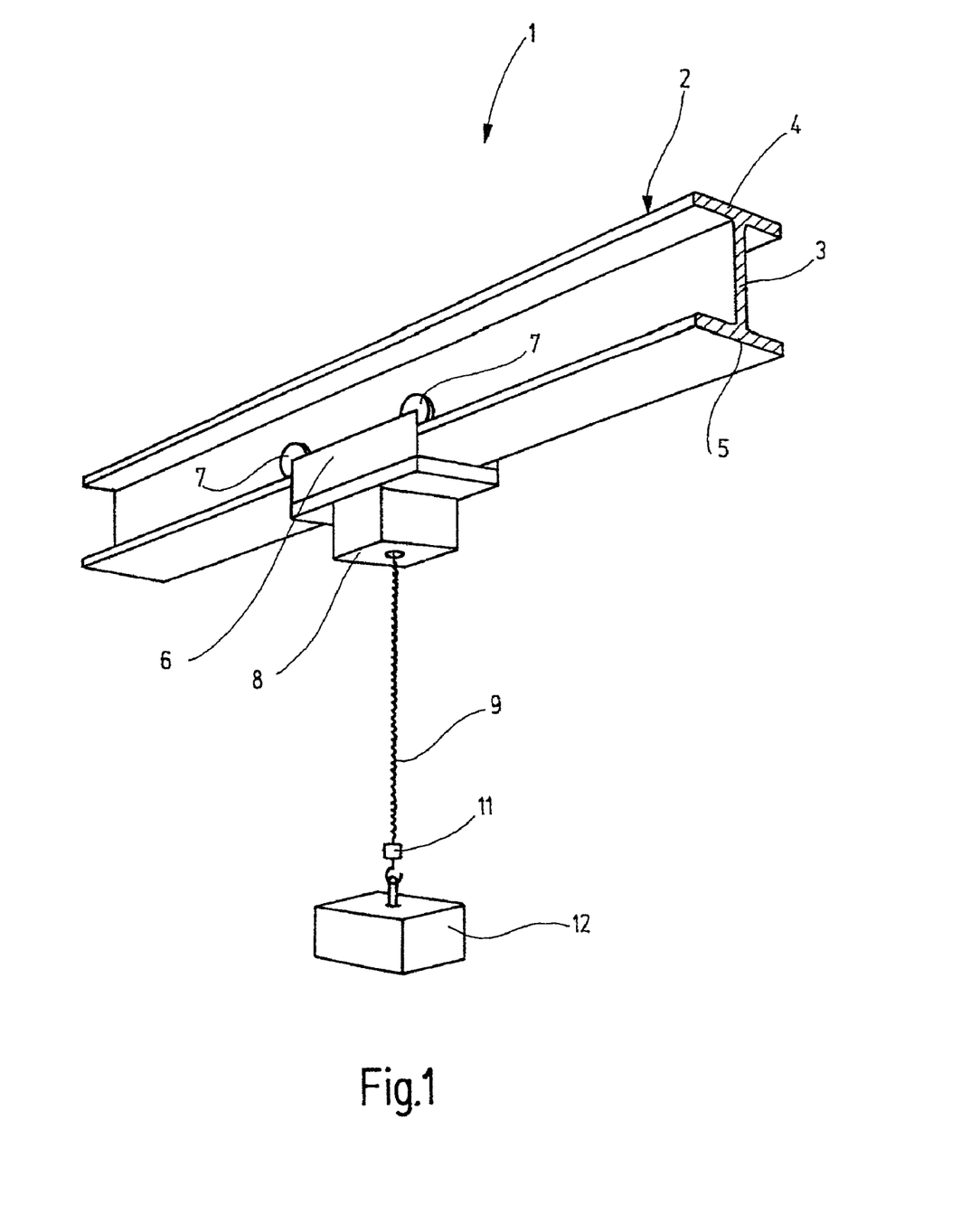
FIG. 1 shows a schematic perspective representation of a bridge crane.

FIG. 1 shows a simplified perspective representation of a bridge crane 1 with a bridge crane beam 2 that can be displaced transverse to its longitudinal direction. As illustrated, the bridge crane beam 2 consists of an I-profile with a crosspiece 3, as well as an upper flange 4 and a lower flange 5. A trolley traveling winch 6 with four rollers 7 rotatably supported thereon can be displaced along the lower flange 5. Only two of the rollers 7 are visible in this figure.

A hoisting device 8 that is realized in the form of a chain block in the illustrated configuration is mounted on the trolley traveling winch 6. The chain block 8 comprises a load receptacle means in the form of a chain 9, on the free end of which a hook 11 is fixed. A load 12 can be suspended on the chain block 8 with the aid of the hook 11.

Figure 2:
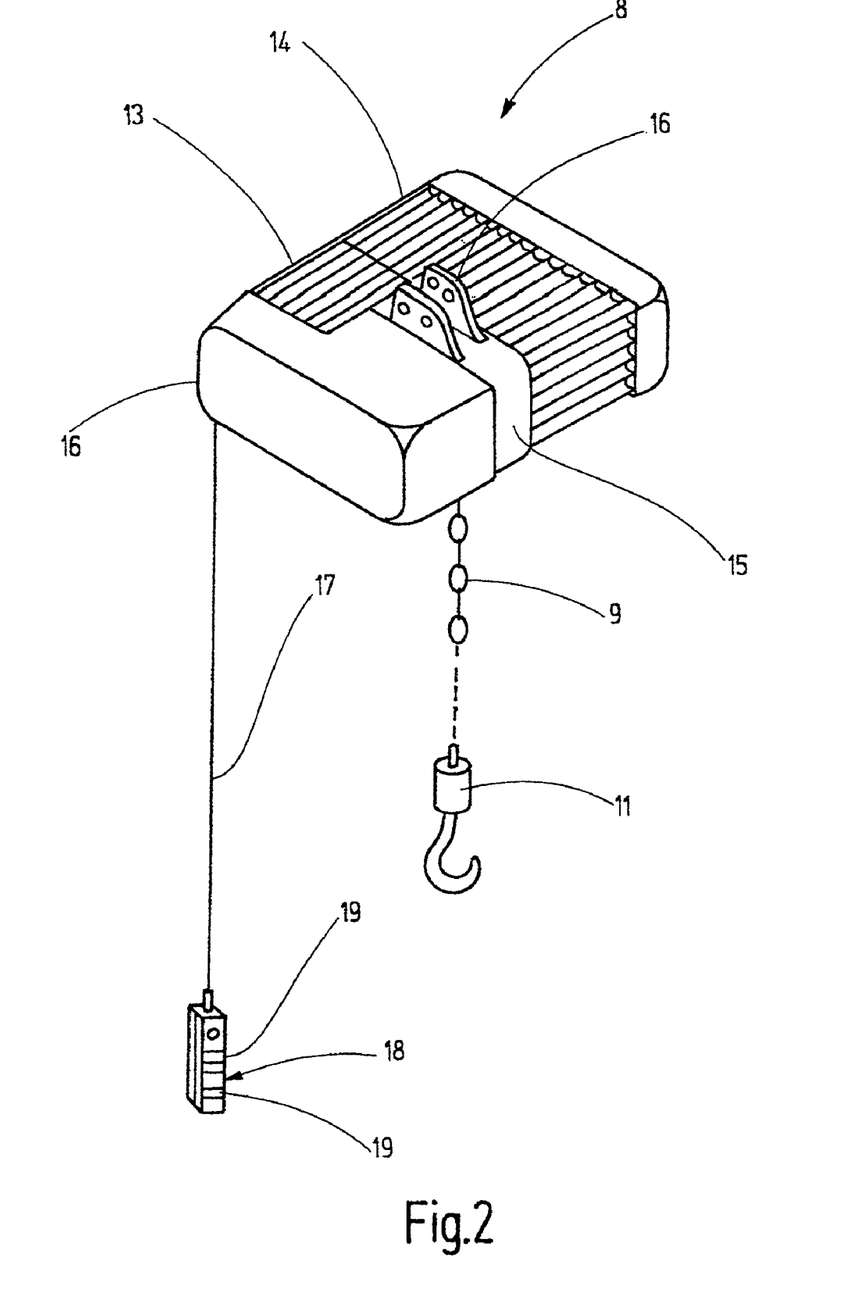
FIG. 2 shows a schematic perspective representation of a chain block.

FIG. 2 shows an enlarged representation of the chain block 8. It comprises a driving motor 13 that drives the input side of a gearbox 14. A chain sprocket of conventional design (not shown) is disposed on the output shaft of the gearbox 14. The chain sprocket revolves in a chain sprocket housing 15 that is fixed on the trolley traveling winch 6 with the aid of suspension straps 16.

The motor 13 and the step-down gear 14 jointly form a geared motor. The driving motor 13 may consist of an asynchronous motor such as, for example, a pole-changing asynchronous motor that has two different hoisting speeds.

On the side that faces away from the gearbox 14, a control box 16 is provided for accommodating the electromechanical and electronic components required for the control of the chain block 8. A cable 17 with a control pad 18 fixed thereon is suspended from the control box. The control pad 18 serves for manually controlling the chain block 8, and contains pushbuttons 19 that make it possible to control the hoisting speed and the moving direction of the load 12. For example, the precision hoisting speed (e.g., slow speed or crawl speed) is activated, namely in the upward direction, by pressing the top button 19 until a stop is reached. When pressing this button beyond the perceivable stop, the hoisting speed is changed over from the precision hoisting speed to the main (e.g., fast or normal) hoisting speed that is faster than the precision hoisting speed by at least the factor 2, e.g., the factor 6. The hoisting device 8 is stopped by releasing the top button 19. Similarly, movement in the opposite direction is controlled in the same fashion with the lower button 19.

Figure 3:
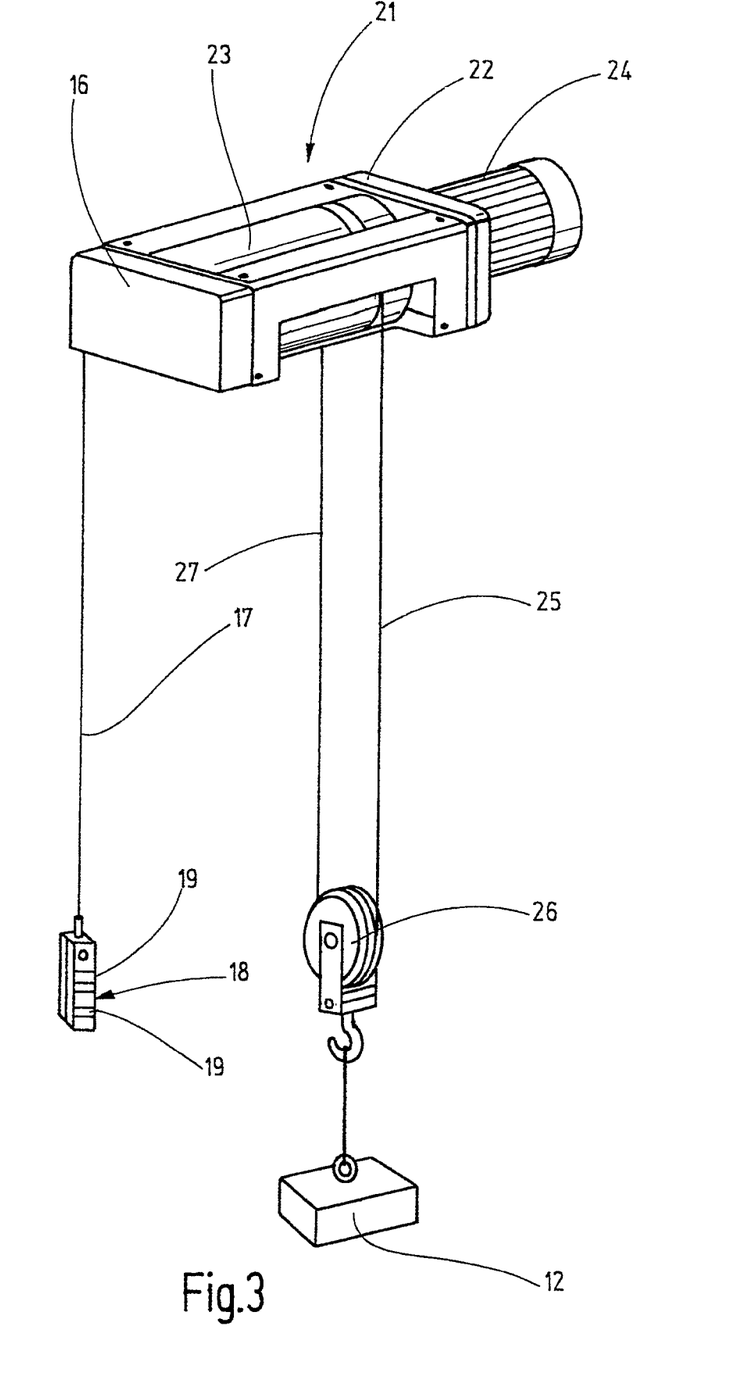
FIG. 3 shows a schematic perspective representation of a tackle.

Instead of equipping the bridge crane 1 with a chain block 8, it is also possible to fix a tackle 21 on the trolley traveling winch 6. The tackle 21 comprises a frame 22, in which a cable drum 23 is rotatably supported. The cable drum 23 is driven by a geared motor 24. A control box 16 is also provided in this case on the side that faces away from the geared motor 24 and is connected to the above-described control pad 18 via the control cable 17.

The tackle 21 shown consists of a so-called two-strand design, in which a cable 25 that can be wound up on the cable drum 23 extends around a snatch block 26 in the form of a linear load receptacle means and forms a second strand 27 that is rigidly anchored on the frame 22 adjacent to the cable drum 23. The tackle 21 may be operated in the same fashion as the chain block 8.

A discussion of other details of the individual types of hoisting devices (e.g., type of brake and other safety measures) is not needed for an understanding of the invention, and these details will be familiar to those of skill in the art.

Based on the preceding explanations, a person skilled in the art will appreciate that the functional unit consisting of the load 12 on one hand and the hoisting device or crane on the other hand forms a vibratory structure that can be excited to vibrate by shock-like movements of the load. Such vibrations consist, for example, of longitudinal vibrations in the linear load receptacle means in the form of the chain 9 or the cable 25, elastic deformations in the frame 22 of the tackle 21, torsional vibrations in the gearbox itself or bending vibrations in the crane support structure, i.e., in the bridge beam 2, wherein the cited elements only represent the primary elements that can significantly contribute to the vibrations. Such vibrations cause the load 12 to move vertically up and down, wherein the apparent load is reduced during an upward movement and increased during a downward movement.

These vibrations cause force peaks in the individual components that are significantly higher than the forces that occur on these components when the load 12 is suspended in a non-vibrating fashion. A person skilled in the art might choose the dimensions for the components of the hoisting device and/or crane in such a way that the maximum attainable dynamic stress as a result of the upward and downward movement of the load 12 does not exceed a critical limiting value.

Figure 4:
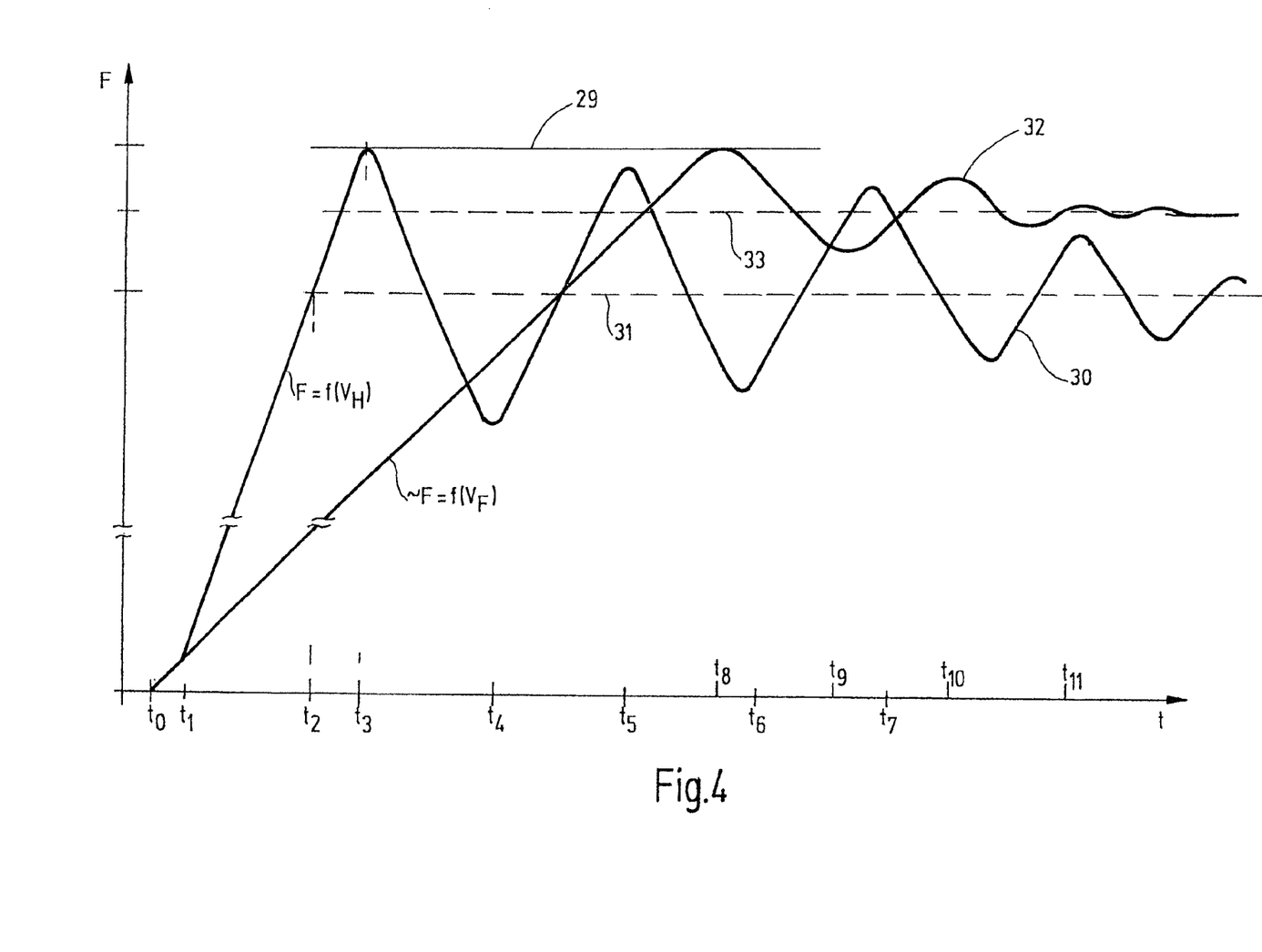
FIG. 4 shows a load diagram, in which ongoing load fluctuations are illustrated.

These circumstances are schematically illustrated in FIG. 4. The critical load limit is illustrated in the form of a straight line 29 in the coordinate system. In this coordinate system, the vertical force occurring on the hook 11 is plotted along the ordinate and the time t is plotted along the abscissa. The varying force is illustrated in the form of a line 30.

It is assumed that a hoisting movement of the load 12 is initiated by a user at the time $t_0$. Since the load receptacle means is initially slack, the force only increases very slowly up to the time $t_1$. Subsequently, the force increases along a straight line, the incline of which is dependent on the elasticity of the system and the selected hoisting speed. It is assumed that the user immediately hoists the load 12 with the main hoisting speed $v_H$. At time $t_2$, the cable tension corresponds to the weight of the load 12. The load 12 henceforth needs to be accelerated to the cable speed. This means that the acceleration force is added to the weight of the load. The cable 25 is additionally tensioned due to the acceleration force. The abrupt acceleration and the cable elongation are superimposed such that a very complex behavior results if the situation is observed in mathematically exact terms. Such a precise analysis and description of the respective processes is not required for comprehending the present invention.

In somewhat simplified terms, it is assumed that the hoisting of the load 12 takes place between the times $t_2$ and $t_3$. The acceleration is concluded at the time $t_3$. The acceleration force decreases proportionally to the acceleration of the load 12 as the abruptly accelerated load 12 gains momentum. At $t_3$, the speed of the load begins to become higher than the cable speed such that the force curve begins to reverse at $t_3$. The peak force F lies above the mean value that corresponds to the static or steady state and is illustrated in the form of a straight line 31. This indicates the beginning of a vibration that slowly decays as a function of time due to damping in the system. The frequency corresponds to the natural resonance of the system, including the load. The first minimum occurs at $t_4$.

Since the vibratory system is dampened due to friction, the amplitude of the excited vibration will decay exponentially as a function of the time. The design and the measuring devices provided in the hoisting device ensure that the first and highest force maximum does not exceed the permissible constructive stability limit 29.

If the user would have hoisted the load 12 with the precision hoisting speed VF instead of the main hoisting speed $v_H$, the force curve would correspond to the flatter curve in FIG. 4, namely in accordance with $F=f(v_F)$. If the load suspended on the hook has the same weight, the expected vibration is not as significant, but the mean value is identical to that indicated with the broken line 31 in the preceding embodiment.

The maximum of the amplitude would clearly lie below the maximum of the load curve 30 for the main hoisting speed. The invention utilizes this phenomenon in that the precision hoisting speed of the hoisting device or crane is activated in order to hoist a load, the weight of which is greater than the permissible maximum load to be hoisted at the main hoisting speed $v_H$. This results in the force curve illustrated in FIG. 4. The force now follows the curve 32 $F=F(v_F)$, in which a first maximum occurs at $t_8$. The first minimum occurs at $t_9$, the next maximum occurs at $t_{10}$, another minimum occurs at $t_{11}$, etc.

Since the amplitude of the excited vibration is lower, it becomes possible to move the mean value represented by the broken line 33 closer to the load limit 29. A higher mean value 33 means a higher weight of the load 12.

If the load has a lower weight, a vibration frequency is adjusted that in an otherwise identical design is lower than the vibration frequency that results from stressing the system with the permissible maximum weight for the main hoisting speed.

The reason for the lower amplitude of the vibration at the precision hoisting speed is the lower kinetic energy that occurs as a result of the abrupt speed change during the jerky separation movement.

Figure 5:
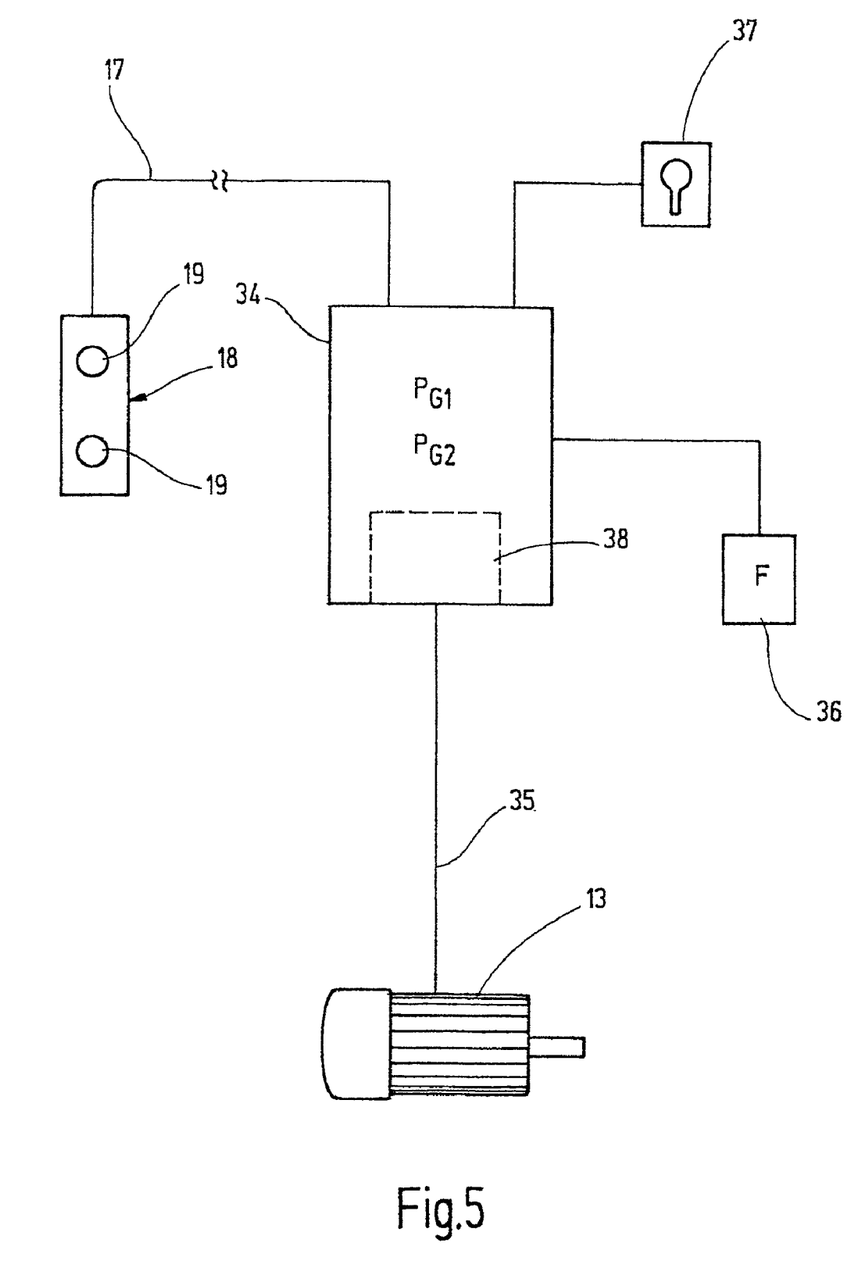
FIG. 5 shows a basic circuit diagram of the inventive arrangement.

A control circuit according to FIG. 5 can be used in order to prevent operating errors. The control pad 18 is connected to the central control 34 situated in the control box 16. A power supply connection 35 extends from the control pad to the asynchronous motor 13 that consists of a pole-changing motor in the embodiment shown. Two rotational speeds or hoisting speeds that differ by the factor 2 can be realized with the aid of the pole-changing motor.

Furthermore, the central control 34 is connected to a force sensor 36 that serves for measuring the hook load. The force sensor 36 is intended to prevent an overload of the hoisting device. The design of such sensors is known to those of skill in the art. Since the specific design is not important, the brief explanation that focuses on the functionality suffices in this respect.

In addition to the ordinary design, a key switch 37 is connected to the control 35. The key switch 37 serves for selecting whether the limiting value $P_{G1}$ or $P_{G2}$ should apply as the limiting value, at which no hoisting movement should be initiated at all. The key switch 37 simultaneously defines whether the corresponding actuation of one of the two pushbuttons 19 results in a change-over from the precision hoisting speed to the main hoisting speed.

The arrangement functions as described hereinafter. When the key switch 37 is in the normal position, the user can activate the precision hoisting speed, as well as the main hoisting speed that is faster, e.g., is 6 times faster, than the precision hoisting speed. The limiting value $P_{G1}$ defined in the control applies in both cases, i.e., the motor 13 is stopped if the sensor 36 signals a hook load that exceeds the limiting value $P_{G1}$. The limiting value $P_{G1}$ corresponds to the mean value 31 plus possible corrections for expected vibrations. If this limiting value is exceeded, the drive is stopped regardless of the actuation of the button 19. In this operating position, the user consequently is able to move the load 12 with a slow or a fast speed.

It may occasionally occur that the user needs to move heavier loads. According to the preceding explanations, such heavy loads can induce a shock when the speed is changed over to the main hoisting speed, and this shock could result in a dynamic force peak that exceeds the limiting value 29 according to FIG. 4. When such a load needs to be hoisted, the key switch 37 is changed over by the user or authorized personnel. This has two different effects, namely the activation of the new limiting value $P_{G2}$ and the blocking of the main hoisting speed. The control on the motor 13 only switches on the winding with the higher pole number in order to ensure that the slower rotational speed remains switched on regardless of how deep the user presses the button 19. Despite the higher hook load, the occurring force peak is lower than the value 29. This enables the user to essentially overload the hoisting device compared to prior devices, wherein the term overload in this context merely refers to an overload that lies above the normal nominal load, but does not exceed the limiting value 29. Such events can be counted with an auxiliary counter in order to ensure timely maintenance procedures because the higher stresses cause the hoisting device to "age" faster than in the normal operating mode.

In the preceding description of the dynamic circumstances and the functional sequence, it was assumed that the shocks occur when the suspended load is moved from a standstill. However, such shocks may also occur if the hoisting speed of a suspended load is reduced to zero due to an emergency situation. Such vibrations can also be induced, for example, when the main hoisting speed is abruptly reduced to the precision hoisting speed. This results in an electric deceleration in the motor that once again leads to a shock that excites the system to vibrate.

The preceding description of the invention was based on a hoisting device that has two discrete speeds. However, the invention is not limited to such applications. On the contrary, it is also possible to use a drive system in which the asynchronous motor 13 is controlled by an inverter 38 that is indicated with dot-dash lines in FIG. 5. In this case, it may also be specified that a certain hoisting speed cannot be exceeded if a higher hook load is permitted. In the inverter drive, this limitation is more important with respect to an emergency stop than a start from a standstill. During a start from a standstill, the inverter can provide a speed curve that avoids shocks. However, shocks caused by emergency stops are generally unavoidable.

In another variation, no key switch 37 is provided and the hoisting device always starts initially at the crawling speed regardless of the actuation of the button 19. If it is determined that the hook load does not exceed the limiting value $P_{G1}$, the control automatically changes over to the main hoisting speed if so desired. However, if the control device 34 determines with the aid of the force sensor 36 that the hook load could lead to a dynamic overload, such a change-over is blocked and the hoisting speed remains at the speed of the precision hoist (crawling speed).

It is also possible to use a continuum of limiting values rather than individual discrete limiting values, wherein the respective limiting value is a function of the hoisting speed. This type of application could be realized with an inverter drive.

Figure 6:
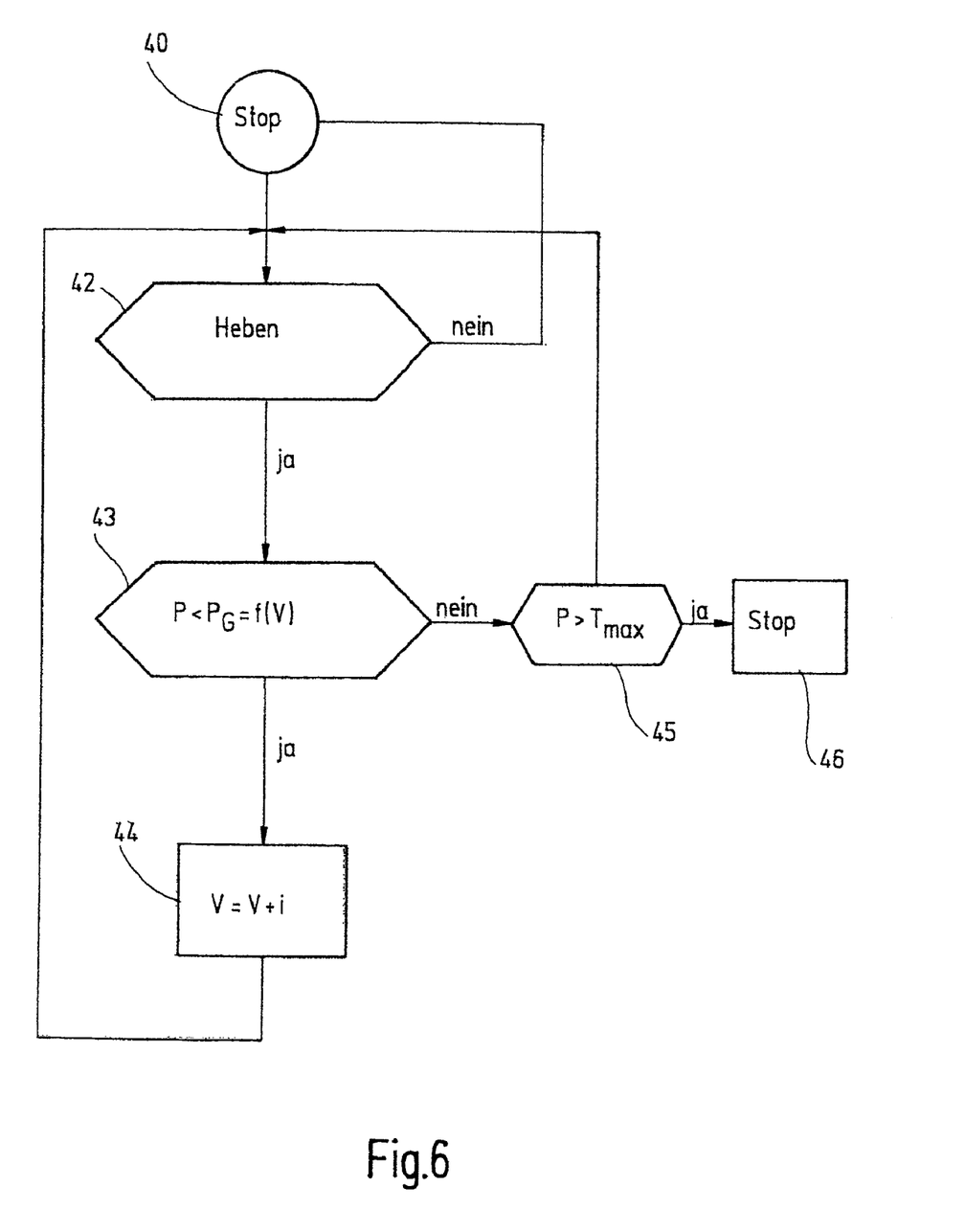
FIG. 6 shows a control flow chart according to FIG. 4.

FIG. 6 shows a schematic flow chart for this purpose. The program starts at stage 40 and inquires at stage 41 whether the command hoisting or lowering from a standstill was issued. If no command was issued, the program returns to the starting point stage 40. Otherwise, the program continues to an inquiry block 43, in which the force on the cable is compared with a limiting value that is dependent on the current hoisting speed. If this limiting value is not exceeded, the program continues to the instruction block 44, in which the speed is increased by a predetermined increment i. If this value is exceeded, however, the program returns to the beginning ahead of the inquiry block 41.

In order to preclude an overload, the feedback contains an inquiry block 45, in which it is checked if the hook load is higher than the possible hook load $P_{MAX}$. If this is the case, the program immediately continues to the instruction block 47 and stops the hoisting device.

It will be appreciated that a novel hoisting device and crane incorporating same have been described. The novel hoist and crane can be operated with at least two different maximum loads. The maximum load that can be hoisted in each case is correlated with the hoisting speed in order to prevent the dynamically developed peak load from exceeding the predetermined allowed load limiting values of the components of the crane or the hoisting device.

What is claimed is:

1. A hoisting device for raising a load, the hoisting device having a maximum load rating and comprising:
  a geared motor that operates to provide a plurality of hoisting speeds including at least first hoisting speed that is a faster hoisting speed and a second hoisting speed that is a slower hoisting speed;
  a load receptacle means that is coupled to the geared motor with the aid of a driving means, configured so as to lift a received load using power of the geared motor;
  a load sensor for determining a weight of the received load on the load receptacle means; and
  an electric control unit that is connected to the load sensor and the geared motor to control the hoisting speed of the geared motor, wherein the control unit enables any selected one of the plurality of hoisting speeds when the weight of the load is equal to or lower than the maximum load rating, and enables only a lower subset of the plurality of hoisting speed when the weight of the load exceeds the maximum load rating, wherein the lower subset of the plurality of hoisting speeds includes the second hoisting speed and excludes the first hoisting speed.

2. The hoisting device according to claim 1, wherein the hoisting device is coupled to a crane together with a crane support structure.

3. The hoisting device according to claim 2, wherein the crane comprises a bridge crane and the hoisting device is accommodated in a trolley traveling winch.

4. The hoisting device according to claim 2, wherein the maximum load rating is chosen such that the load resulting from hoisting speeds within the lower subset remains lower than a damage threshold load of the hoisting device, including any components of the hoisting device and the crane support structure of the hoisting device.

5. The hoisting device according to claim 1, wherein the hoisting device includes one of a chain block and a tackle.

6. The hoisting device according to claim 1, wherein the geared motor is an asynchronous motor.

7. The hoisting device according to claim 6, wherein the asynchronous motor is a pole-changing asynchronous motor.

8. The hoisting device according to claim 1, wherein a frequency converter is associated with the geared motor in order to control the hoisting speed of the geared motor.

9. The hoisting device according to claim 8, wherein the frequency converter allows a continuum of hoisting speeds between a lower limiting value and an upper limiting value.

10. The hoisting device according to claim 1, wherein only a predetermined number of discrete hoisting speeds can be selected.

11. The hoisting device according to claim 1, wherein the linear load receptacle means includes a cable.

12. The hoisting device according to claim 1, wherein the linear load receptacle means includes a chain.

13. The hoisting device according to claim 1, wherein the driving means consists of a cable drum.

14. The hoisting device according to claim 1, wherein the driving means consists of a chain sprocket.

15. The hoisting device according to claim 1, wherein the control unit comprises an inverter.

16. The hoisting device according to claim 1, wherein the plurality of hoist speeds includes only the first hoist speed and the second hoist speed.

17. The hoisting device according to claim 1, further comprising a manually actuated button for each of the first hoisting speed and the second hoisting speed are each moving direction of the load receptacle means.

18. The hoisting device according to claim 1, wherein the control unit contains a counter for counting the number of events during which the hoisting device was used for hoisting a load having a weight greater than the maximum load rating.

* * * * *